United States Patent [19]
Prall et al.

[11] Patent Number: 5,341,016
[45] Date of Patent: Aug. 23, 1994

[54] LOW RESISTANCE DEVICE ELEMENT AND INTERCONNECTION STRUCTURE

[75] Inventors: Kirk D. Prall; Gurtej S. Sandhu; Scott G. Meikle, all of Boise, Id.

[73] Assignee: Micron Semiconductor, Inc., Boise, Id.

[21] Appl. No.: 78,700

[22] Filed: Jun. 16, 1993

[51] Int. Cl.$^5$ .............................. H01L 27/02
[52] U.S. Cl. .................. 257/412; 257/753; 257/915
[58] Field of Search ........... 257/412, 413, 753, 755, 257/770, 915

[56] References Cited

U.S. PATENT DOCUMENTS 5,221,853  6/1993  Joshi et al. ............... 257/755
5,268,590 12/1993  Pfiester et al. ........... 257/915

FOREIGN PATENT DOCUMENTS 2-299268 12/1990  Japan ..................... 257/755

OTHER PUBLICATIONS

New Method to Improve the Adhesion Strength of Tungsten Thin Film on Silcon by $W_2N$ Glue Layer, Appl. Phys. Lett. 61(5), 3 Aug. 1992.

Primary Examiner—Rolf Hille
Assistant Examiner—Robert Limanek
Attorney, Agent, or Firm—John D. Buchaca

[57] ABSTRACT

A composite semiconductor structure which replaces polysilicon for conductive device elements and provides lower resistance interconnections between devices. The preferred structure is a conductive adhesion layer deposited in place of polysilicon in contact with a conductive metal layer traversing the interconnection. The preferred material for the adhesion layer is tungsten nitride, and for the metal layer—tungsten. If polysilicon is retained for device elements, the adhesion and metal layers may be placed in contact with the polysilicon element and along the interconnect structure providing an interconnect with lower resistance. Increased adhesion may be obtained by adding a cap layer of dielectric material atop the metal layer.

18 Claims, 4 Drawing Sheets

LOW RESISTANCE DEVICE ELEMENT AND INTERCONNECTION STRUCTURE

FIELD OF THE INVENTION

This invention relates to the field of semiconductor design and fabrication, and more particularly, to structures and methods for increasing the conductivity and reliability of electrical interconnection structures and conductive device elements in semiconductors.

BACKGROUND OF THE INVENTION

Semiconductor integrated circuits contain many distinct electronic devices having conductive elements as part of the device structure. In order to operate as a circuit, each device needs to be electrically interconnected with other devices. Interconnection occurs during the fabrication process by forming an intricate network of conductive material in contact with certain elements of the devices.

For example, part of a semiconductor integrated circuit may be made up of hundreds of discrete field effect transistors having interconnected gate electrodes. The typical structure of this device is shown in FIG. 1. Here, a single crystal silicon substrate 1 has doped regions forming the source 2 and drain 3 of a transistor. The gate electrode 4 is formed by a layer of conductive polycrystalline silicon (polysilicon or simply "poly") above an insulating gate oxide layer 5. Although less conductive, polysilicon has advantages over conductive metals, since it allows for lower threshold voltages and higher density of cells. Since it has a moderately low sheet resistivity, the polysilicon layer can be extended to adjacent devices, providing interconnection as shown in FIG. 2. Each device 6 has its gate formed by the extended polysilicon region 7 which forms a ridge above the planar substrate. Similarly, memory devices using structures such as stacked capacitors use polysilicon in forming their plate regions and in interconnecting adjacent devices.

Although polysilicon has low sheet resistivity, it still has limitations. Interconnect lines made of poly must have a relatively large cross-section to be conductive enough to operate effectively. This in turn increases the size of the overall integrated circuit, reducing speed and flexibility while increasing cost.

The long thin poly lines interconnecting an array of memory devices are driven by row driver circuits. The maximum length of line handled by a single driver is determined by the time it takes for signals to travel down the line—the RC time constant. When the time gets too long, more row drivers must be added in parallel to reduce the total resistance, increasing overall chip size. Conversely, less drivers are needed when the interconnect lines are more conductive.

If conductivity were the only design criterion, silver or aluminum would be the material of choice to form device interconnections. However, many of the processes required in fabricating semiconductor integrated circuits use high heat. Both of these metals have relatively low melting points subjecting them and surrounding material to corruption during subsequent fabrication steps. Their relatively high coefficients of thermal expansion compared to materials such as silicon and silicon dioxide used in the fabrication of other microcircuit elements can cause stress, warping and separation as the metals expand and retract over such materials. Other usefully conductive metals such as gold and copper rapidly diffuse through the substrate forming generation sites, thereby reducing minority carrier lifetime and degrading refresh performance in memory devices.

Currently, the methods and structures used for decreasing the sheet resistivity of polysilicon involve tungsten and titanium which although less conductive than silver, have a much higher melting point and smaller coefficient of thermal expansion. FIG. 3 shows one such method where a layer of tungsten silicide 8 (WSi$_x$, where X is any integer greater than or equal to 1, but most commonly 2 or 3 when used in integrated circuits) has been deposited atop the poly layer 9. Common methods for depositing WSi$_x$ are physical vapor deposition (PVD or sputtering) and chemical vapor deposition (CVD). This resulting combination of layers is called WSi$_x$ polycide. The minimum sheet resistance for WSi$_x$ polycide is about 5–10 ohms per square.

Using titanium instead of tungsten provides greater conductivity, however, other problems arise. Titanium silicide (TiSi$_x$) is formed by first depositing a layer titanium atop the poly, then heating it. The resulting titanium silicide layer can suffer from severe aglomeration problems if the TiSi$_x$ layer is exposed to temperatures greater than 850° C. Since many fabrication processes require high heat, the use of TiSi$_x$ becomes restricted. For example, stacked capacitor DRAM processes require deposition of the titanium after the first poly deposition, with many processes left to be performed. Other problems with using TiSi$_x$ include unwanted dopant segregation and diffusion of titanium down through the poly into the substrate during heating which can reduce minority carrier lifetime during operation. In addition, etching TiSi$_x$ is difficult because the layer created is very rough, having non-uniform thickness. This makes it difficult to stop etching the TiSi$_x$ without penetrating into the underlying poly layer. If the titanium is etched prior to its conversion into TiSi$_x$, the volume change due to thermal exansion and contraction which occurs during conversion may cause cracks or voids to form.

It is desirable therefore, to have a structure which increases the conductivity of device elements and interconnections without the drawbacks descibed above.

SUMMARY OF THE INVENTION

The principal and secondary objects of this invention are to provide a structure and associated method of fabrication for increasing the conductivity of device elements and interconnect lines while maintaining high reliablity without unduly increasing the costs of fabrication.

These and other objects are achieved by forming a composite conductive device element and interconnection structure using tungsten nitride in place of polysilicon and adding a layer of tungsten in contact with the tungsten nitride layer. Because tungsten nitride adheres so well to silicon and silicon dioxide, it can actually replace polysilicon as the conductive material for forming device elements. The tungsten layer provides increased conductivity along the interconnect lines.

If polysilicon must be used, an adhesion layer of tungsten nitride, tungsten silicide or other adhesion material is formed between a layer of tungsten and the polysilicon along the interconnect line. The sandwiched tungsten silicide or tungsten nitride layer provides an adhesion layer between the polysilicon and the tungsten while retarding diffusion between silicon and tungsten.

Increased adhesion may be obtained by adding a cap layer of dielectric material atop the tungsten layer.

DESCRIPTION OF THE PREFERRED EMBODIMENTS OF THE INVENTION

These preferred emodiments are directed toward the construction of an insulated gate field effect transistor (IGFET), however those practiced in the art will readily see applications of this invention to other devices and interconnections.

Figure 1:
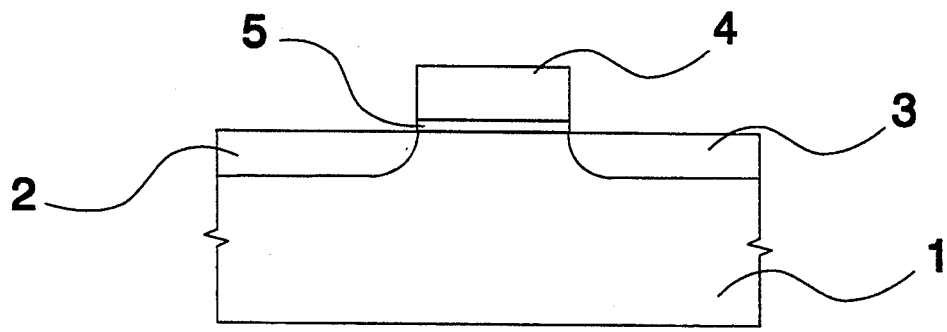
FIG. 1 is a cross-sectional view of an insulated gate field effect transistor (IGFET) typical in the art.
Figure 2:
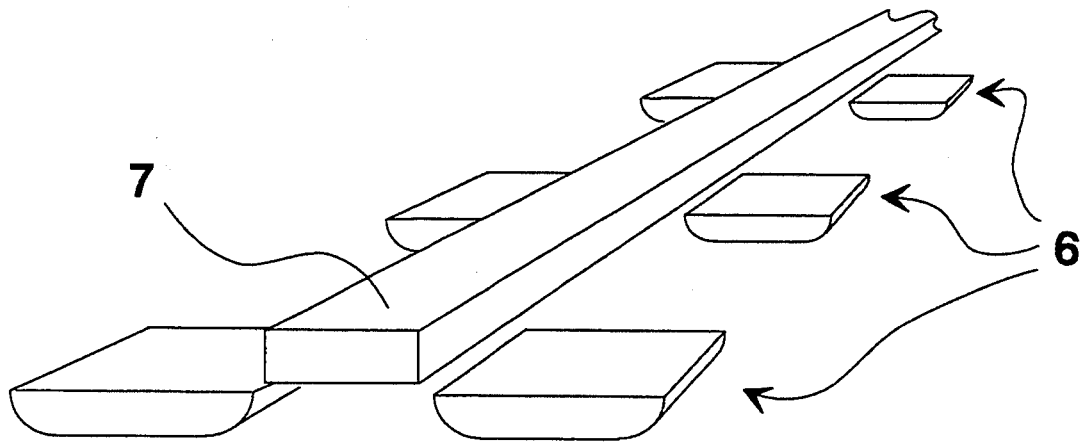
FIG. 2 is an idealized perspective view showing the polysilicon interconnection between a number of IGFET's typical in the prior art.
Figure 3:
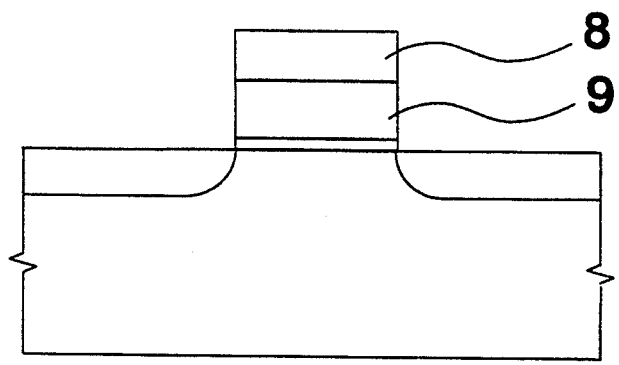
FIG. 3 is a cross-sectional view of an IGFET using a prior art solution to increasing the conductivity of polysilicon interconnect lines.
Figure 4:
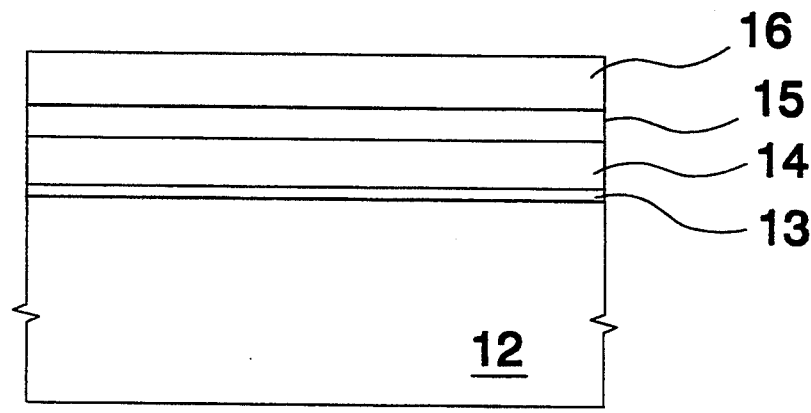
FIG. 4 is a cross-sectional view of a semiconductor substrate during an intermediate processing step showing successive layers of what will become conductive device elements and interconnect structures.

Referring now to the drawing, FIG. 4 shows an IGFET during an intermediate processing step after the gate electrode and interconnect layers have been built atop a mono-crystalline silicon substrate 12. Each of the following layers is successively built atop the substrate. First, is a gate oxide layer 13 followed by an adhesion layer of tungsten nitride 14, a conductive metal layer of tungsten 15 and finally, an optional dielectric cap layer 16 of oxide, nitride or a combination of both.

Figure 5:
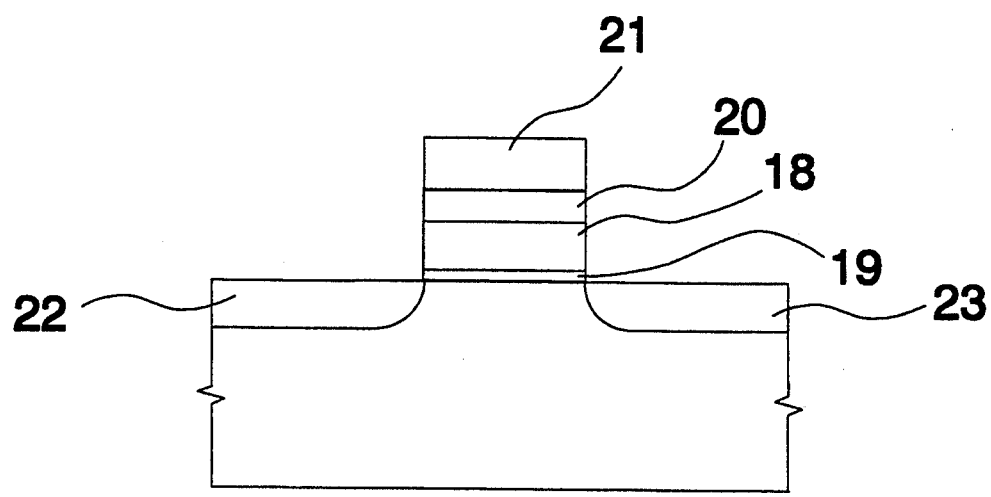
FIG. 5 is a cross-sectional view of an IGFET having the gate electrode formed by conductive adhesion material.

After masking, etching and removing the photoresist layer, FIG. 5 shows a cross-section of the ridge-like gate electrode and interconnect structure 17 of the transistor constructed according to the invention. The tungsten nitride layer 18 situated directly above the gate oxide layer 19 acts as the transistor gate electrode. The tungsten layer 20 improves interconnect conductivity, and the dielectric cap layer 21 provides primarily added adhesion support for the tungsten layer. Both the source 22 and drain 23 regions have been implanted into the exposed substrate, leaving the transistor ready for subsequent processing. Such processing would include insulating spacer formation, contact formation and in the case of DRAM cells, capacitor formation.

Figure 6:
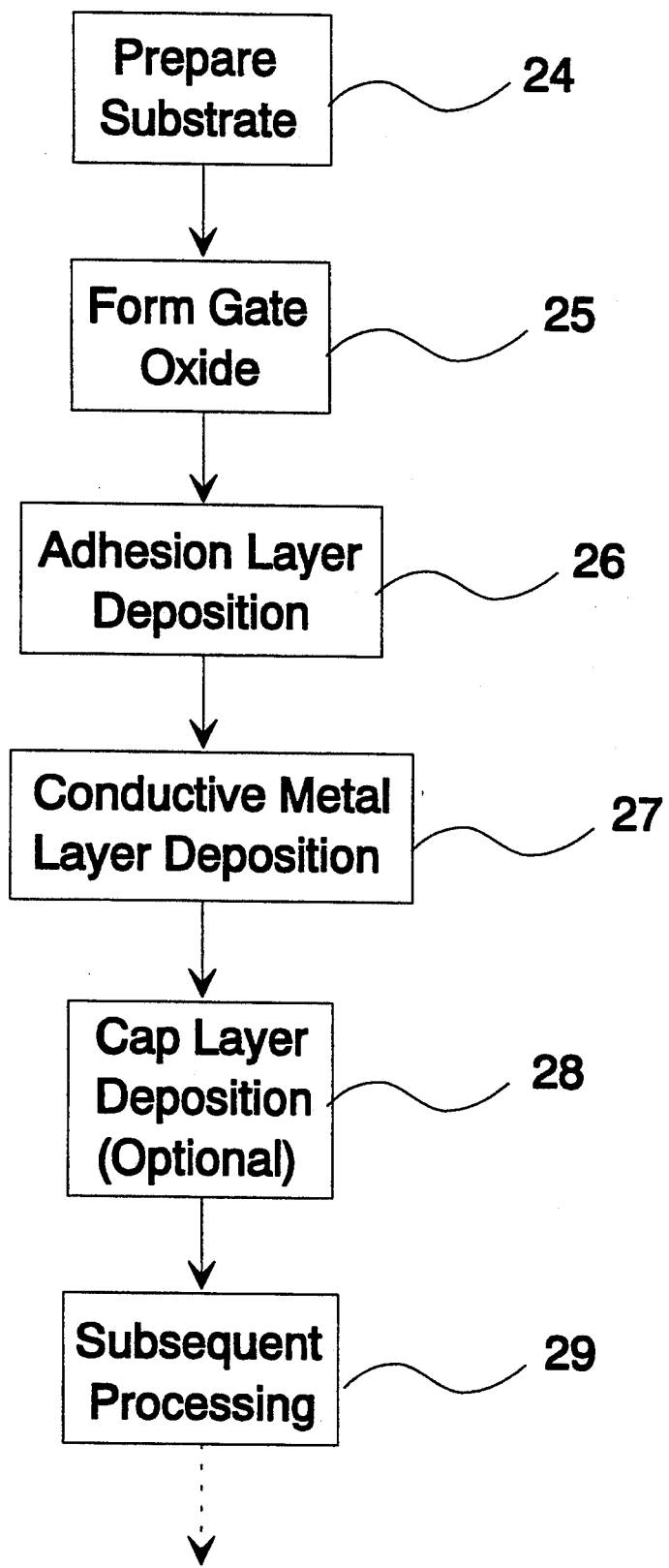
FIG. 6 is a flow chart diagram of the fabrication steps required in producing the structure according to the invention.

FIG. 6 shows the key fabrication steps necessary to produce the transistor of FIG. 5. First, a proper substrate is prepared 24, upon which a gate oxide layer is formed 25. An adhesion layer of conductive material such as tungsten nitride is deposited 26 on top of the gate oxide using chemical vapor deposition or other means, and optionally annealed. Next, a layer of conductive metal 27 with a high melting point and a high reaction temperature with silicon such as tungsten is deposited atop the adhesion layer, and optionally annealed. Optionally, a cap layer 28 of oxide or nitride or both is deposited atop the metal layer. The resulting layered structure of silicon dioxide, tungsten nitride, tungsten and cap (SiO$_2$/WN/W/cap) is an example of the invention. The rest of the subsequent processing 29 involves steps familiar to practitioners in the art such as masking, etching to form the interconnecting ridge, source and drain implantation, spacer formation, any additional implantation, contact formation, capacitor formation, etc.

Figure 7:
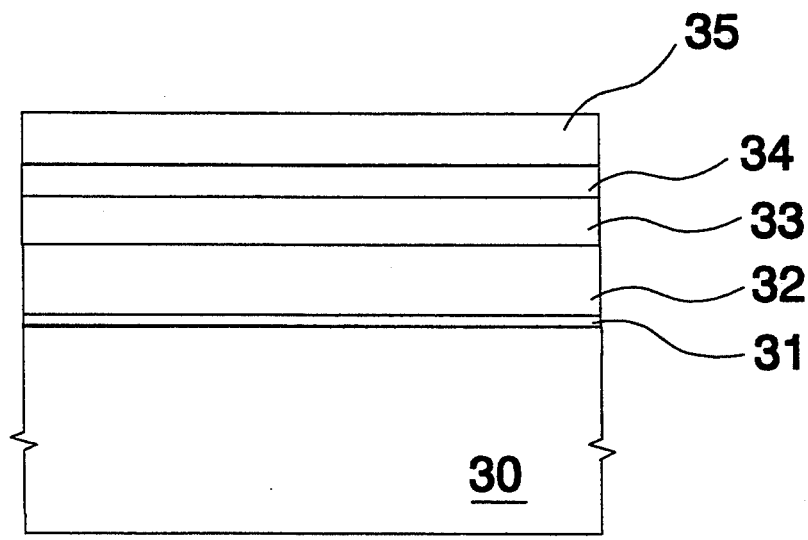
FIG. 7 is a cross-sectional view of a semiconductor substrate during an intermediate processing step showing successive layers of device element and interconnect material.

If the conductive structures of certain devices or their interconnection require polysilicon, the invention can be adapted to accomodate polysilicon. FIG. 7 shows the IGFET during an intermediate processing step after the gate electrode layer of polysilicon and the interconnect layers have been successively built atop a mono-crystalline silicon substrate 30. First, there is a gate oxide layer 31 followed by a doped polysilicon layer 32, a tungsten silicide layer 33, a tungsten layer 34 and finally, an optional dielectric cap layer 35.

Figure 8:
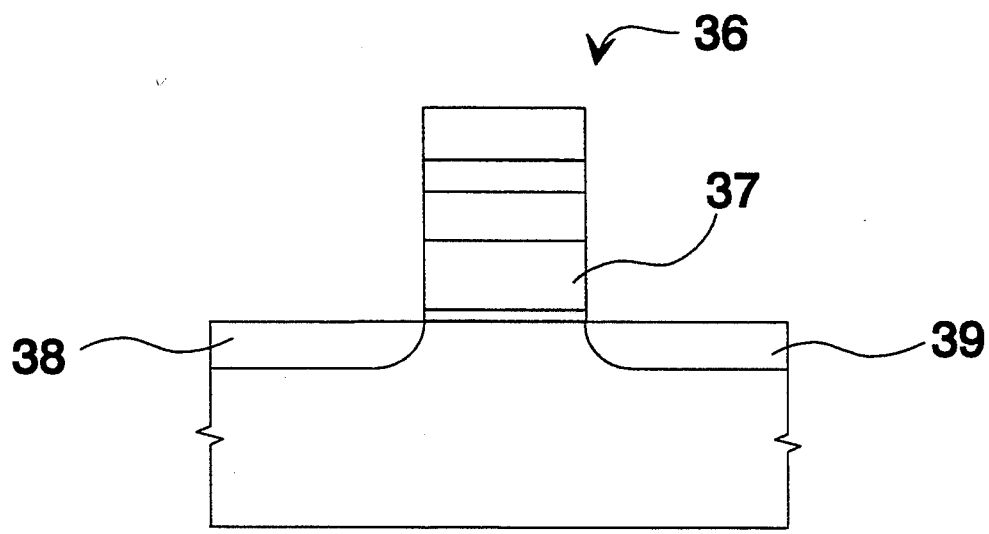
FIG. 8 is a cross-sectional view of an IGFET having a gate electrode formed by conductive polysilicon with enhanced interconnect conductivity layers.

After masking, etching and removing the photoresist layer, FIG. 8 shows a cross-section of the ridge interconnect structure 36 at the transistor which uses polysilicon as its gate electrode 37 and uses the invention to increase the interconnection conductivity. Here, both the source 38 and drain 39 regions have been implanted into the exposed substrate, leaving the transistor ready for subsequent processing.

The fabrication steps necessary to produce the transistor of FIG. 8 are only slightly different from those required when polysilicon is not used for the gate electrode. The difference is of course depositing a layer of polysilicon on top of the gate oxide, doping and optionally annealling the poly prior to the deposition of the adhesion layer. The resulting layered structure of silicon dioxide, polysilicon, tungsten silicide, tungsten and cap (SiO$_2$/WSi$_x$/W/cap) is an example of the invention when the use of polysilicon is necessary. As descibed above, the rest of the subsequent processing steps are familiar to practitioners in the art.

Since WSi$_x$ has a resistivity of 30–50 $\mu$ohm-cm and tungsten has a resistivity of 10 $\mu$ohm-cm, replacing WSi$_x$ of the prior art with tungsten reduces the sheet resistance by a factor of $\frac{1}{3}$ to 1/5. This allows for structures with a resistance a low as 2 ohms/square which is not possible using existing WSi$_x$ methods alone. Using tungsten nitride in place of polysilicon reduces the resistance even more.

Whether or not polysilicon is used, decreased sheet resistance allows for a reduction in size due to the decreased number of row drivers necessary. This decrease in size translates directly into an increase in speed and decrease in cost. Also, the earlier described problems plaguing the use of TiSi$_x$ are avoided.

The cap layer deposited above the tungsten layer helps promote adhesion of the tungsten to the WSi$_x$ or WN. It can also serve as a hard mask during the subsequent ridge forming etch of the oxide/WN/W/cap or oxide/poly/WSi$_x$/W/cap layers if the integrity of the photoresist becomes an issue.

This invention is compatible with devices using self aligned source and drain techniques, self aligned contacts, stacked capacitors and with other devices using interconnecting polysilicon such as floating gate flash memory cells.

Of course, tungsten silicide is not the only material available for use as a conductive barrier layer between polysilicon and tungsten; tungsten nitride works here as well. Tungsten nitride offers the added advantage of increasing adhesion between the tungsten and poly layers and is more impervious than tungsten silicide to subsequent diffusion of silicon and tungsten into susceptible neighboring regions. Also, it may discourage diffusion of the poly dopant into the more conductive regions. The advantages are described in detail in the reference: *New Method to Improve the Adhesion Strength of Tungsten Thin Film on Silicon by W2N Glue Layer*, Y. T. Kim, et al., Appl. Phys. Lett., 61 (5), Aug. 3, 1992, pg. 537. Other possible barrier layer materials exhibiting the advantages noted above include: titanium nitride (TIN), tungsten silicon nitride (WSiN), titanium aluminum nitride (TiAlN), tantalum nitride (TAN) and tantalum silicon nitride (TaSiN), among others. Other metals exhibiting a high melting point, a high reaction temperature with silicon and are conductive may be used in place of tungsten.

While the preferred embodiments of the invention have been described, modifications can be made and other embodiments may be devised without departing from the spirit of the invention and the scope of the appended claims.

What is claimed is:

1. A composite electrically conductive structure for interconnecting semiconductor integrated circuit devices comprising:
    a gate dielectric layer;
    a conductive non-polysilicon adhesion layer in direct mechanical and electrical contact with said gate dielectric layer;
    a conductive metal layer in direct mechanical and electrical contact with said adhesion layer;
    wherein said metal layer is not in direct mechanical contact with said devices; and
    wherein said adhesion layer acts as a device element of one of said devices.

2. A composite electrically conductive structure for interconnecting semiconductor integrated circuit device elements comprising:
    a gate dielectric layer;
    a conductive adhesion layer in direct mechanical and electrical contact with said gate dielectric layer;
    a conductive metal layer in direct mechanical and electrical contact with said adhesion layer;
    wherein said metal layer is not in direct mechanical contact with said gate dielectric being contacted by said adhesion layer; and
    wherein aid adhesion layer is made from a material selected from a group consisting of tungsten nitride, titanium nitride, tungsten silicon nitride, titanium aluminum nitride, tantalum nitride and tantalum silicon.

3. The structure of claim 2, further comprising:
    a layer of polycrystalline silicon having at least one part acting as one of said device elements.

4. The structure of claim 3, wherein:
    said adhesion layer is formed above said poly layer, and
    said metal layer is formed above said adhesion layer.

5. The structure of claim 4, which further comprises:
    a cap layer of dielectric material formed above said metal layer.

6. The structure of claim 5, wherein said cap layer comprises an oxide.

7. The structure of claim 5, wherein said cap layer comprises a nitride.

8. The structure of claim 4, which further comprises:
    a semiconductor substrate having a substantially planar surface;
    a dielectric layer formed over said surface; and
    said poly layer formed over said dielectric layer.

9. The structure of claim 8, wherein:
    at least one of the parts of said poly layer acts as a field effect transistor gate electrode.

10. In a semiconductor insulated gate field effect transistor comprising:
    a substrate having a first doped region forming a source and a second doped region forming a drain, said source being spaced apart from said drain forming within said substrate a channel therebetween,
    a gate dielectric layer formed over said substrate,
    a polycrystalline silicon layer formed over said gate dielectric layer, said polycrystalline silicon layer being configured and positioned over said channel to form a gate electrode, and
    a conductive structure connecting said gate electrode to another circuit element;
    an improvement comprising:
        said conductive structure including an adhesion layer formed over and in direct contact with said polycrystalline silicon layer;
        a metal layer formed over said adhesion layer; and
        wherein said adhesion layer is a material selected from a group consisting of:
    tungsten nitride, titanium nitride, tungsten silicon nitride, titanium aluminum nitride, tantalum nitride and tantalum silicon nitride.

11. The transistor of claim 10, wherein said metal layer consists of a layer of tungsten.

12. A semiconductor insulated gate field effect transistor comprising:
    a substrate having a first doped region forming a source and a second doped region forming a drain, said source being spaced apart from said drain forming within said substrate a channel therebetween;
    a gate dielectric layer formed over said substrate;
    a conductive adhesion layer formed over and in direct contact with said gate dielectric layer, said adhesion layer being configured and positioned over said channel to form a gate electrode;
    a metal layer formed over said adhesion layer, said metal layer not directly contacting said dielectric layer; and
    wherein said adhesion layer is made of a material selected from a group consisting of:
    tungsten nitride, tungsten silicide, titanium nitride, tungsten silicon nitride, titanium aluminum nitride, tantalum nitride and tantalum silicon nitride.

13. The transistor of claim 12, wherein said metal layer consists of a layer of tungsten.

14. The structure of claim 2, wherein said metal layer comprises a layer of tungsten.

15. The structure of claim 1, wherein said adhesion layer is made from a material selected from a group consisting of tungsten nitride, tungsten silicide, titanium nitride, tungsten silicon nitride, titanium aluminum nitride, tantalum nitride and tantalum silicon nitride.

16. The structure of claim 15, which further comprises:
    a cap layer of dielectric material in direct mechanical contact with said metal layer.

17. The structure of claim 16, wherein said metal layer comprises a layer of tungsten.

18. The structure of claim 17, wherein said adhesion layer is created through a process of chemical vapor deposition.

* * * * *